United States Patent
Min et al.

(10) Patent No.: US 9,484,488 B1
(45) Date of Patent: Nov. 1, 2016

(54) CIGSSE THIN FILM FOR SOLAR CELL, PREPARATION METHOD THEREOF AND ITS APPLICATION TO THIN FILM SOLAR CELL

(71) Applicant: KOREA INSTITUTE OF SCIENCE AND TECHNOLOGY, Seoul (KR)

(72) Inventors: Byoung Koun Min, Seoul (KR); Yun Jeong Hwang, Seoul (KR); Se Jin Park, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/952,115

(22) Filed: Nov. 25, 2015

(30) Foreign Application Priority Data

Apr. 22, 2015 (KR) ........................ 10-2015-0056833

(51) Int. Cl.
- H01L 21/00 (2006.01)
- H01L 31/20 (2006.01)
- H01L 31/032 (2006.01)
- H01L 31/065 (2012.01)
- H01L 21/02 (2006.01)
- H01L 31/0392 (2006.01)
- H01L 31/18 (2006.01)

(52) U.S. Cl.
CPC ....... *H01L 31/208* (2013.01); *H01L 21/02568* (2013.01); *H01L 31/0322* (2013.01); *H01L 31/0323* (2013.01); *H01L 31/03923* (2013.01); *H01L 31/065* (2013.01); *H01L 31/1864* (2013.01)

(58) Field of Classification Search
CPC ........... H01L 31/0322; H01L 31/1864; H01L 31/065; H01L 31/208; H01L 31/03923; H01L 31/0323; H01L 21/02568; Y02E 10/541; Y02E 10/543
See application file for complete search history.

(56) References Cited

U.S. PATENT DOCUMENTS

| | | | | |
|---|---|---|---|---|
| 5,858,121 A * | 1/1999 | Wada | .................. | H01L 31/0322 136/264 |
| 8,741,685 B2 * | 6/2014 | Taunier | ............... | H01L 31/0322 438/84 |
| 8,859,406 B2 * | 10/2014 | Liang | ...................... | H01L 31/18 438/509 |
| 2008/0305247 A1 * | 12/2008 | Von Klopmann | ........ | H01L 21/67109 427/74 |
| 2012/0115312 A1 * | 5/2012 | Agrawal | ................ | B82Y 30/00 438/478 |
| 2014/0113403 A1 * | 4/2014 | Van Duren | ....... | H01L 21/02557 438/95 |

FOREIGN PATENT DOCUMENTS

JP     2014-107558 A    9/2014

* cited by examiner

*Primary Examiner* — Michael Trinh
(74) *Attorney, Agent, or Firm* — Goldilocks Zone IP Law

(57) ABSTRACT

Provided is a CIGSSe thin film for a solar cell, a method for preparing the same, and a solar cell using the same. More particularly, the CIGSSe thin film for a solar cell shows a decrease in peak intensity of sulfur from the surface of the thin film to the local minimum value point of sulfur content in the depth direction, after the analysis based on the Auger electron spectroscopy, and thus controls the band-gap in the thin film. Therefore, the solar cell including the CIGSSe thin film shows an excellent effect in improving photoelectric conversion efficiency.

9 Claims, 4 Drawing Sheets

CIGSSE THIN FILM FOR SOLAR CELL, PREPARATION METHOD THEREOF AND ITS APPLICATION TO THIN FILM SOLAR CELL

CROSS-REFERENCE TO RELATED APPLICATIONS

This application claims priority under 35 U.S.C. §119 to Korean Patent Application No. 10-2015-0056833 filed on Apr. 22, 2015, in the Korean Intellectual Property Office, the disclosure of which is incorporated herein by reference in its entirety.

TECHNICAL FIELD

The following disclosure relates to a CIGSSe light-absorbing layer thin film for a solar cell, a method for preparing the same, and a solar cell using the same. More particularly, the following disclosure relates to a CIGSSe thin film for a solar cell that shows an excellent effect in controlling the band-gap in the CIGSSe thin film to improve photoelectric conversion efficiency, a method for preparing the same and a solar cell using the same.

BACKGROUND

A photovoltaic cell, i.e., a solar cell means a device by which solar energy can be converted into electric energy. Particularly, when light is input to the photosensitive material contained in the photovoltaic cell, electrons and holes are generated by the so-called photovoltaic effect, thereby producing electric current and voltage. Since such a photovoltaic cell can obtain electric energy from pollution-free solar energy that is source of all types of energies, active studies have been conducted about photovoltaic cells in view of development of alternative energy.

Solar cells are classified into various types depending on materials used for a light-absorbing layer. Currently, silicon solar cells using silicon are used most frequently. However, while cost of silicon has been increased rapidly due to the lack of silicon supply, many attentions have been given to thin film solar cells. Since thin film solar cells are manufactured to have a small thickness, they require low consumption of materials and have a low weight, and thus can be applied to various industrial fields. As a material for a thin film solar cell, amorphous silicon, CdTe, CIS, CIGS or CIGSSe have been studied intensively.

A CIS, CIGS or CIGSSe thin film is one of the I—III-VI compound semiconductors including elements such as Cu, In, Ga, S, Se, or the like, and provides the highest conversion efficiency among the pilot thin film solar cells. Particularly, such a thin film solar cell can be manufactured to have a thickness of 10 micrometers or less, is stable even during long-term use, and thus is expected to be an economic high-efficiency solar cell capable of substituting for a silicon solar cell.

Particularly, CIGSSe having a high absorption coefficient and structural stability may be referred to as the most spotlighted light-absorbing layer as a material succeeding to a silicon solar cell. In addition, CIGSSe has an advantage in that it can realize absorbing layers having different band-gaps through the control of relative ratio of In to Ga and S to Se. A CIGSSe solar cell is driven by the junction of a p-type semiconductor and n-type semiconductor, and the operation of a CIGSSe solar cell largely depends on the band-gap and doping degree of each material. Recently, many studies have been conducted to improve transfer and operation of electrons by applying element concentration distribution or band-gap grading technology to a heterojunction structure as mentioned hereinafter.

In the case of a conventional solution process-based CIGSSe solar cell, it is expected that introduction of such a grading structure overcomes the problem of efficiency relatively lower than the efficiency of a vacuum process-based solar cell. In the case of an element deposition process based on a vacuum process, it is possible to form a concentration grading of the elements in a thin film with ease by controlling the proportion of a deposited element during the deposition process. However, when preparing a CIGSSe thin film based on a solution process, there is a problem in that it is relatively difficult to control the concentration distribution of elements in a thin film and to adjust a band-gap.

SUMMARY

An embodiment of the present disclosure is directed to providing a CIGSSe thin film for a solar cell in which the band-gap is controlled during a solution process, and a method for preparing the same.

Another embodiment of the present disclosure is directed to providing a solar cell including the CIGSSe thin film to improve transfer of electrons in p-n junction, and a method for preparing the same.

In one aspect, there is provided a CIGSSe thin film for a solar cell which shows a decrease in peak intensity of sulfur from the surface of the thin film to the local minimum value point of sulfur content in the depth direction, after the analysis based on the Auger electron spectroscopy.

In another aspect, there is provided a method for preparing a CIGSSe thin film for a solar cell, including the steps of:

(A) heating a substrate coated with CIG (Cu—In—Ga) oxide under the atmosphere in which a gaseous sulfur precursor and gaseous selenium precursor are present; and (B) consuming the gaseous selenium precursor completely, and then further heating the substrate under the atmosphere of the gaseous sulfur precursor.

In still another aspect, there is provided a solar cell including the CIGSSe thin film.

In yet another aspect, there is provided a method for preparing a solar cell, including the steps of: forming a CIGSSe thin film on a first electrode; and forming a second electrode layer on the CIGSSe thin film.

The CIGSSe thin film for a solar cell disclosed herein shows a controlled band-gap in the thin film, and thus provides an excellent effect in improving photoelectric conversion efficiency when applied to a solar cell.

In addition, the method for preparing a CIGSSe thin film includes supplying selenium and sulfur at the same time and carrying out heat treatment, and thus is effective for controlling the concentration distribution of elements in a thin film during a solution process and a band-gap.

Further, the solar cell including the CIGSSe thin film improves transfer of elements in p-n junction and shows high efficiency.

DETAILED DESCRIPTION OF EMBODIMENTS

The advantages, features and aspects of the present disclosure will become apparent from the following description of the embodiments.

In one aspect, there is provided a CIGSSe thin film for a solar cell which shows a decrease in peak intensity of sulfur from the surface of the thin film to the local minimum value point of sulfur content in the depth direction, after the analysis based on the Auger electron spectroscopy.

As used herein, 'local minimum value' does not refer to the minimum value that is the smallest value in the whole thickness but refers to the smallest value as compared to the other values around thereof.

Figure 3:
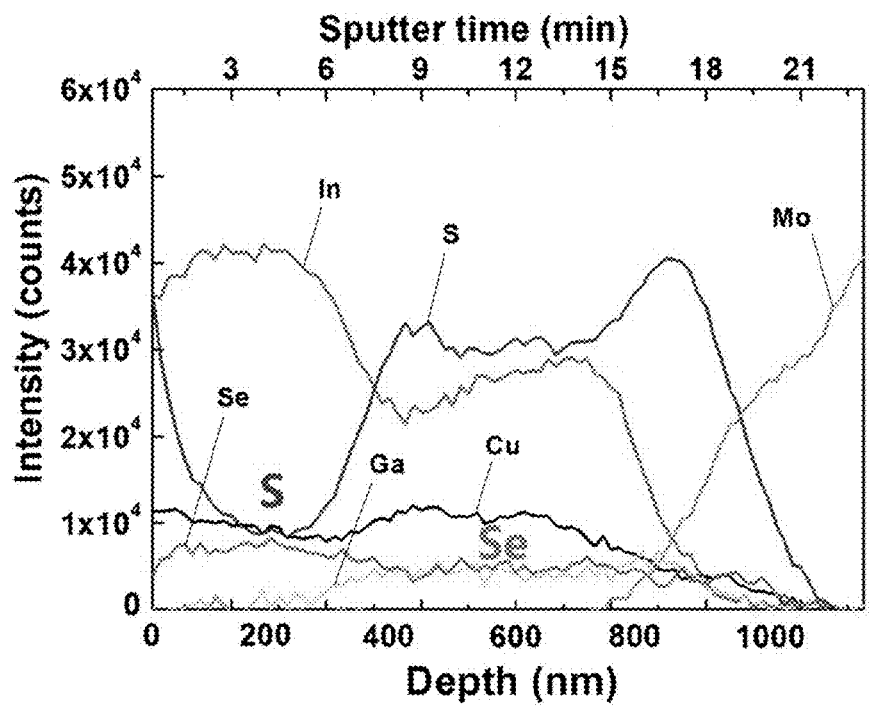
FIG. 3 is an element distribution diagram obtained after carrying out depth profiling of the CIGSSe thin film according to Example 1 through an Auger electron spectrometer.
Figure 4:
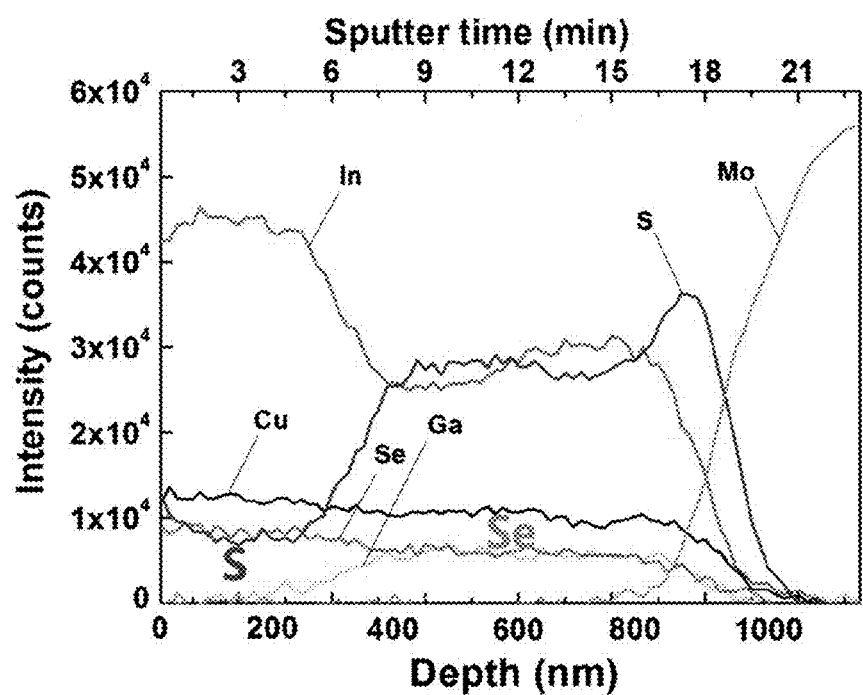
FIG. 4 is an element distribution diagram obtained after carrying out depth profiling of the CIGSSe thin film according to Example 2 through an Auger electron spectrometer.

Thus, in the CIGSSe thin film for a solar cell according to an embodiment, sulfur content decreases from the surface to the local minimum value point of sulfur content in the depth direction, and increases again at the local minimum value point, as shown in FIG. 3. Such a phenomenon means that the band-gap in the thin film is formed based on a double-grading model.

When the content of an element in a thin film is constant, a non-grading model having a constant band-gap is formed. Meanwhile, when sulfur content increases gradually from the surface in the depth direction, a normal-grading model is formed. On the contrary, when sulfur content increases from the surface to the local minimum value point and then increases again at the local minimum value point, a double-grading model is formed. When such a CIGSSe thin film having a controlled band-gap is applied to a solar cell, it shows effects of improving transfer of electrons in the thin film and interrupting electron-hole recombination at the interface of p-n junction, resulting in a significant increase in photoelectric conversion efficiency.

According to another embodiment, the local minimum value point of sulfur content preferably exists within a range of $1/10$-$4/10$, more preferably $2/10$-$3/10$, based on the thin film thickness, from the surface in the depth direction. This facilitates formation of a strong electric field to reduce electron-hole recombination and to increase electron-hole collection, thereby providing improved photoelectric conversion efficiency.

In addition, the sulfur content curve in the form of a parabola opened to the top (e.g. a decrease in sulfur content from 0 to 400 nm of the depth in FIG. 3) preferably has a width corresponding to $1/10$-$5/10$ based on the thin film thickness. When the width is smaller or larger than the above-defined range, transfer of electrons and absorption of light may be interrupted undesirably.

Further, preferably, the element content ratio of sulfur/(sulfur+selenium) at the surface of the thin film is 0.25-0.5 and that of sulfur/(sulfur+selenium) at the local minimum value point of sulfur content is 0.05-0.2. When the ratio is larger than the maximum value of surface content ratio or smaller than the local minimum value of sulfur content, transfer of electrons may be degraded undesirably. When the ratio is smaller than the minimum value of surface content ratio or larger than the maximum value of minimum content ratio, a band-gap of double-grading model cannot be formed.

In another aspect, there is provided a method for preparing a CIGSSe thin film for a solar cell, including the steps of: (A) heating a substrate coated with CIG (Cu—In—Ga) oxide under the atmosphere in which a gaseous sulfur precursor and gaseous selenium precursor are present; and (B) consuming the gaseous selenium precursor completely, and then further heating the substrate under the atmosphere of the gaseous sulfur precursor.

According to an embodiment, the heating in step (B) may be carried out preferably by increasing the temperature to a temperature higher than the heating temperature in step (A). More preferably, the heating in step (B) may be carried out by increasing the temperature to a temperature 10-100° C. higher than the heating temperature in step (A). As mentioned above, the heating in step (B) carried out to a temperature higher than the heating temperature in step (A) controls the sulfur content and selenium content in the thin film during a non-vacuum solution process, thereby forming a band-gap of double-grading model. This overcomes the problem of a difficulty in controlling the content of an element during a conventional solution process, and thus shows an excellent effect in providing a high-efficiency solar cell.

Particularly, the heating in step (A) may be carried out preferably at a temperature of 400-500° C. for 1-60 minutes and the heating in step (B) may be carried out preferably at a temperature of 510-600° C. for 1-60 minutes. When the heating temperature is lower than the minimum of the above-defined range, it is not possible to form a grading sufficiently. When the heating temperature is higher than the maximum of the above-defined range, an excessive grading may occur to cause a drop in absorptivity in a longer wavelength range and physical degradation of a substrate.

Figure 1:
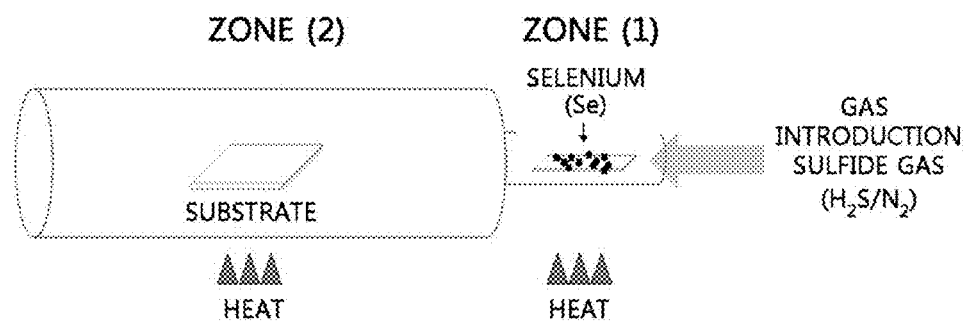
FIG. 1 is a schematic view illustrating a heat treatment step according to an embodiment.
Figure 2:
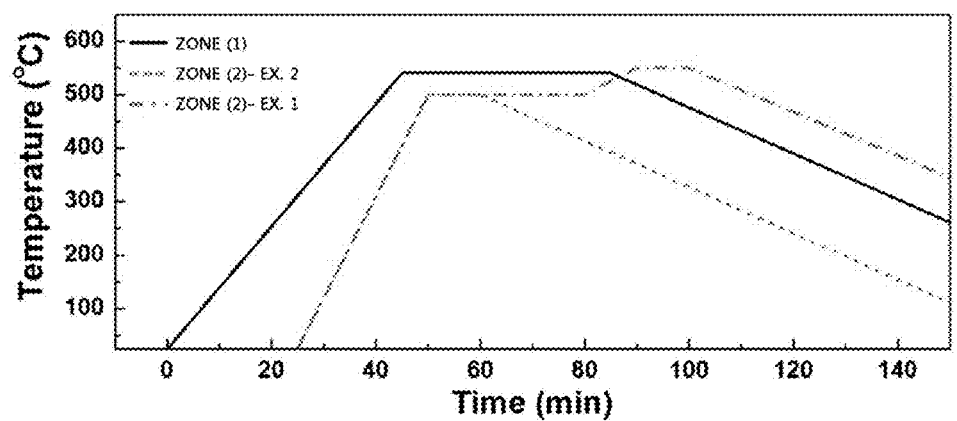
FIG. 2 is a graph illustrating temperatures and times of a heat treatment step according to an embodiment.

In this context, FIG. 1 is a schematic view illustrating the heat treatment steps (A) and (B) according to a non-limiting embodiment of the present disclosure. As shown in FIG. 1, the heating in steps (A) and (B) may be carried out in zone (1) and zone (2) separately by using a tube-type heating furnace. The heating in step (A) may be carried out preferably by introducing selenium pellets to zone (1), introducing a CIG oxide-coated substrate to zone (2), and carrying out heating at a temperature of 400-500° C. for 1-60 minutes while allowing $H_2S$ to flow through the heating furnace. After the selenium pellets are heated and its vapor is consumed completely, heat treatment may be carried out preferably at a temperature of 510-600° C. for 1-60 minutes. At that time, $H_2S$ is also allowed to flow. In other words, it is possible to form a thin film in which sulfur and selenium are present simultaneously by supplying a gaseous sulfur precursor and a gaseous selenium precursor at the same time as mentioned above. It is preferred to use selenium vapor as a selenium precursor rather than $H_2Se$ gas to ensure stability.

The CIG oxide may be coated on a substrate preferably by applying a paste containing Cu, In and Ga precursors to the substrate through spin coating or doctor blade coating, and carrying out heat treatment at a temperature of 250-350° C. for 1-60 minutes. When carrying out heat treatment as mentioned above, carbon impurities in the thin film are removed and Cu, In and Ga elements react with oxygen to form an amorphous CIG oxide thin film. Particularly, the substrate may be at least one selected from substrates on which a conductive film, such as molybdenum (Mo), fluorine tin oxide (FTO) or indium tin oxide (ITO), is formed.

In still another aspect, there is provided a solar cell including the CIGSSe thin film.

In yet another aspect, there is provided a method for preparing a solar cell, including the steps of: forming a CIGSSe thin film on a first electrode; and forming a second electrode layer on the CIGSSe thin film.

Detailed description of the method for preparing a CIGSSe thin film is the same as described above, and thus will be omitted herein.

According to an embodiment, the first electrode may be preferably at least one selected from molybdenum, fluorine tin oxide and indium tin oxide. However, any material may be used with no particular limitation, as long as it has conductivity and transparency.

The second electrode is formed on the CIGSSe thin film and may be preferably at least one selected from molybdenum, fluorine tin oxide, indium tin oxide, nickel and aluminum.

The solar cell may further include a buffer layer containing cadmium sulfide and optionally further containing at least one metal oxide selected from titanium dioxide, zinc oxide and tin oxide.

The examples and experiments will now be described. The following examples and experiments are for illustrative purposes only and not intended to limit the scope of this disclosure. In addition, it will be apparent to those skilled in the art that various changes and modifications may be made based on the disclosure of the present disclosure including the following examples.

Example 1

First, a molybdenum (Mo) substrate is coated with a paste containing Cu, In and Ga precursors by a spin coating or doctor blading process, and heat treated under air at 300° C. for 30 minutes to remove the carbon impurities in the thin film and to allow the Cu, In and Ga elements to react with oxygen, thereby forming an amorphous CIG oxide thin film.

The CIG oxide thin film is heat treated by using a tube-type heating furnace as shown in FIG. 1. Then, the CIG oxide thin film is introduced to zone (2) and 0.5 g of selenium pellets is introduced zone (1) as a selenium source. After that, sulfide gas ($H_2S/N_2$) is allowed to flow through the heating furnace for about 15 minutes to stabilize the atmosphere in the reactor. During the reaction of the CIG oxide thin film, the temperature of zone (1) is increased first at a rate of 15° C./minute to supply selenium and sulfur elements at the same time. Once the temperature reaches about 320° C. after exceeding the melting point of selenium, 221° C., warming of zone (2) is started. After zone (2) is warmed to 500° C. and maintained at this temperature for 30 minutes, it is warmed again to 550° C. and maintained at this temperature for 10 minutes. In this manner, a CIGSSe thin film is obtained.

Example 2

A CIGSSe thin film is obtained in the same manner as Example 1, except that warming of zone (2) is started once the temperature of zone (1) reaches about 320° C. and the temperature of zone (2) is maintained at 500° C. for 10 minutes.

Comparative Example 1

A CIG oxide thin film is heat treated under $H_2S/N_2$ gas to form a CIGS thin film, and then selenium is supplied under the same heat treatment conditions as Example 2 while Ar gas is introduced during the heat treatment.

Preparation Examples 1-3

A CdS buffer layer is formed on the molybdenum substrate coated with each of the thin films obtained according to Examples 1 and 2 and Comparative Example 1 through a chemical wet process. Then, an i-ZnO/Al—ZnO layer (RF sputtering) and Ni/Al top electrode (e-beam evaporation) are deposited to provide a solar cell.

Preparation Examples 4 and 5

Preparation Example 1 is repeated, except that a fluorine tin oxide or indium tin oxide substrate is used instead of the molybdenum substrate.

Preparation Examples 6 and 7

Preparation Example 3 is repeated, except that a fluorine tin oxide or indium tin oxide substrate is used instead of the molybdenum substrate.

Test Example 1

Figure 5:
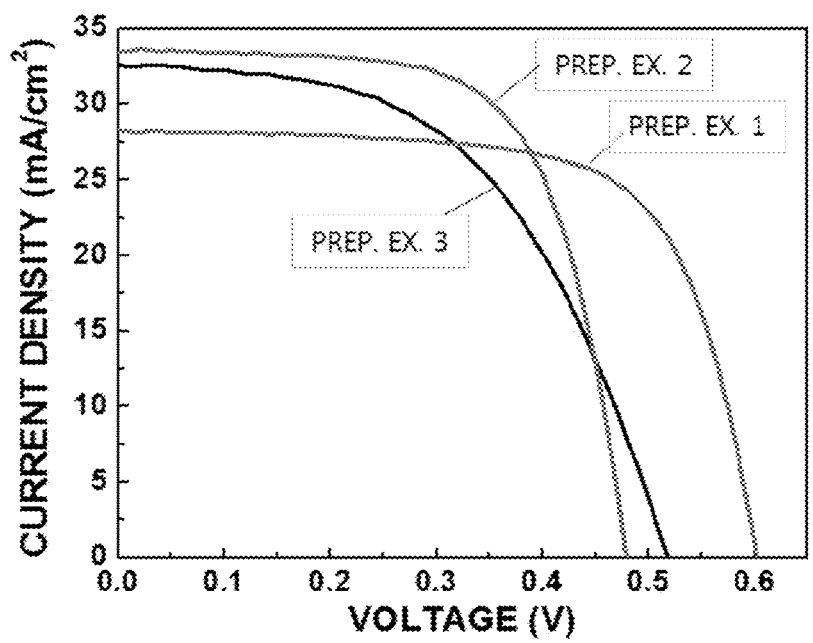
FIG. 5 is a graph illustrating the current density-voltage curves of the solar cells obtained according to Preparation Examples 1-3.
Figure 6:
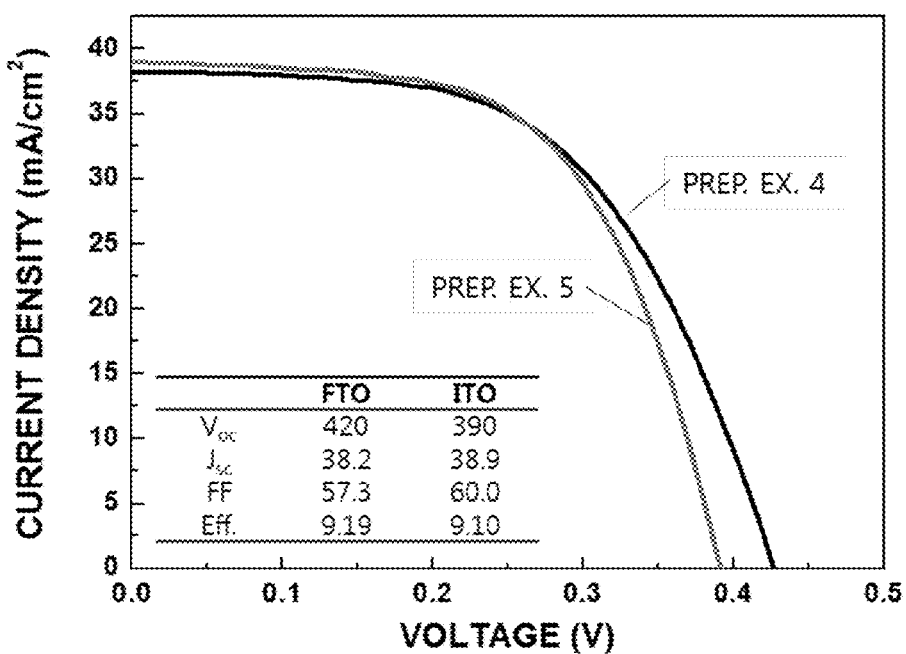
FIG. 6 is a graph illustrating the current density-voltage curves of the solar cells obtained according to Preparation Examples 4 and 5.

Each of the solar cells obtained from Preparation Examples 1-5 is analyzed for its current density-voltage curve, and the results are shown in FIG. 5 and FIG. 6 and the following Table 1. (Note: The current density-voltage analysis is carried out by using CompactStat available from Ivium-Technologies Co. (Netherlands), and using Sun2000 solar simulator available from ABET Technologies Co. (USA) to meet the condition of AM 1.5).

As shown in FIG. 5 and Table 1, the solar cell obtained from Preparation Example 1 shows a voltage of 601 mV, charging ratio of 68.6% and an efficiency of 11.7%, as compared to the solar cells obtained from Preparation Examples 2 and 3. It can be seen that such effects are derived from the two-step heat treatment carried out during the preparation of the CIGSSe thin film, suggesting that the energy band in the thin film forms a double graded band-gap structure to improve transfer of electrons in the thin film and to interrupt electron-hole recombination at the p-n junction interface, thereby improving the efficiency of the cell.

TABLE 1

|  | $V_{OC}$ (mV) | $J_{SC}$ (mA/cm$^2$) | F.F. (%) | Eff. (%) |
| --- | --- | --- | --- | --- |
| Prep. Ex. 1 | 601 | 28.3 | 68.6 | 11.7 |
| Prep. Ex. 2 | 478 | 33.5 | 66.1 | 10.6 |
| Prep. Ex. 3 | 518 | 32.6 | 52.2 | 8.81 |

FIG. 6 shows a graph illustrating the current density-voltage curves of the solar cells obtained from Preparation Examples 4 and 5. Herein, a transparent conduction oxide, fluorine tin oxide or indium tin oxide, is used instead of molybdenum. It can be seen that the effect of such an oxide is lower as compared to molybdenum.

Therefore, the CIGSSe thin film according to the present disclosure shows a controlled band-gap in the thin film, and thus provides an excellent effect in improving photoelectric conversion efficiency when applied to a solar cell.

In addition, the method for preparing a CIGSSe thin film including supplying selenium and sulfur at the same time and carrying out heat treatment is effective for controlling the band-gap in the thin film during a solution process.

Further, the solar cell including the CIGSSe thin film improves transfer of electrons in p-n junction and shows high efficiency.

Test Example 2

Figure 7:
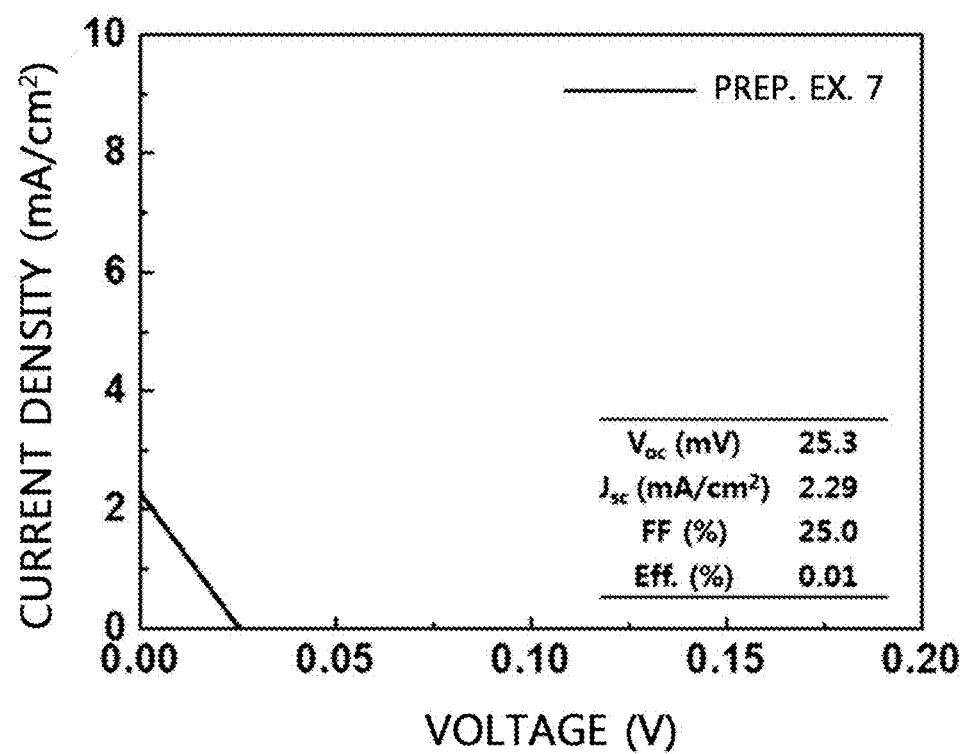
FIG. 7 is a graph illustrating the current density-voltage curve of the solar cell obtained according to Preparation Example 7.

The solar cell obtained from Preparation Example 7 is analyzed for its current density-voltage curve, and the results are shown in FIG. 7.

As shown in FIG. 7, Preparation Example 7 shows significant degradation of quality as compared to Preparation Example 5. Preparation Example 6 also shows results similar to Preparation Example 7. This suggests that each device shows degradation of quality due to the damage on the transparent conductive oxide, fluorine tin oxide or indium tin oxide, used as a first electrode during a selenization process.

As a result, it can be seen that the heat treatment method of a CIGSSe thin film for a solar cell according to the present disclosure may be applied to both a molybdenum thin film and a transparent conductive substrate without any particular limitation.

What is claimed is:

1. A method for preparing a CIGSSe thin film for a solar cell, comprising the steps of:
   (A) heating a substrate coated with CIG (Cu—In—Ga) oxide under the atmosphere in which a gaseous sulfur precursor and gaseous selenium precursor are present; and
   (B) consuming the gaseous selenium precursor completely, and then further heating the substrate under the atmosphere of the gaseous sulfur precursor.

2. The method for preparing a CIGSSe thin film for a solar cell according to claim 1, wherein the heating in step (B) is carried out by increasing the temperature to a temperature higher than the heating temperature in step (A).

3. The method for preparing a CIGSSe thin film for a solar cell according to claim 1, wherein the heating in step (B) is carried out by increasing the temperature to a temperature 10-100° C. higher than the heating temperature in step (A).

4. The method for preparing a CIGSSe thin film for a solar cell according to claim 1, wherein the heating in step (A) is carried out at a temperature of 400-500° C. for 1-60 minutes.

5. The method for preparing a CIGSSe thin film for a solar cell according to claim 1, wherein the heating in step (B) is carried out at a temperature of 510-600° C. for 1-60 minutes.

6. The method for preparing a CIGSSe thin film for a solar cell according to claim 1, wherein the gaseous sulfur precursor is $H_2S$, and the gaseous selenium precursor is selenium vapor.

7. The method for preparing a CIGSSe thin film for a solar cell according to claim 1, wherein the CIG oxide is coated on the substrate by heat treating a paste including Cu, In and Ga precursors.

8. The method for preparing a CIGSSe thin film for a solar cell according to claim 1, wherein the CIG oxide is coated on the substrate through a spin coating or doctor blading process.

9. The method for preparing a CIGSSe thin film for a solar cell according to claim 1, wherein the substrate is at least one selected from molybdenum, fluorine tin oxide and indium tin oxide.

* * * * *